United States Patent
Korec et al.

(10) Patent No.: US 6,348,712 B1
(45) Date of Patent: Feb. 19, 2002

(54) HIGH DENSITY TRENCH-GATED POWER MOSFET

(75) Inventors: Jacek Korec, San Jose; Mohamed N. Darwish, Campbell; Dorman C. Pitzer, San Jose, all of CA (US)

(73) Assignee: Siliconix Incorporated, San Jose, CA (US)

( * ) Notice: Subject to any disclaimer, the term of this patent is extended or adjusted under 35 U.S.C. 154(b) by 0 days.

(21) Appl. No.: 09/428,299

(22) Filed: Oct. 27, 1999

(51) Int. Cl.[7] .............................................. H01L 29/76
(52) U.S. Cl. ........................ 257/330; 257/322; 257/321
(58) Field of Search ................................. 257/330, 322, 257/321, 323; 357/23.4, 23.1, 23.8; 438/263, 264

(56) References Cited

U.S. PATENT DOCUMENTS 6,285,060 B1 * 9/2001 Korec ......................... 257/342

FOREIGN PATENT DOCUMENTS

EP          0 583 028 A1    2/1994    ......... H01L/29/784

* cited by examiner

Primary Examiner—Olik Chaudhuri
Assistant Examiner—Nathan W. Ha
(74) Attorney, Agent, or Firm—Skjerven Morrill MacPherson LLP; David E. Steuber (57) ABSTRACT

A trench-gated power MOSFET contains a highly doped region in the body region which forms a PN junction diode with the drain at the center of the MOSFET cell. This diode has an avalanche breakdown voltage which is lower than the breakdown voltage of the drain-body junction near to the wall of the trench. Thus the MOSFET breaks down in the center of the cell avoiding the generation of hot carriers that could damage the gate oxide layer. The drain-body junction is located at a level which is above the bottom of the trench, thereby avoiding any deep diffusion that would increase the cell width and reduce the cell packing density. This compact structure is achieved by limiting the thermal budget to which the device is exposed after the body region is implanted. As a result, the body and its highly doped region do not diffuse significantly, and dopant from the highly doped region does not get into the channel region of the device so as to increase its threshold voltage.

9 Claims, 9 Drawing Sheets

HIGH DENSITY TRENCH-GATED POWER MOSFET

FIELD OF THE INVENTION

This invention relates to power MOSFETs and in particular to a power MOSFET which has a greater cell packing density and therefore a lower on-resistance but without sacrificing the ability of the MOSFET to resist punchthrough breakdown.

BACKGROUND OF THE INVENTION

The design of a power MOSFET entails a number of objectives, many of which are in conflict. Several important objectives are: to minimize the resistance of the device when it is turned on, frequently referred to as the "on-resistance"; with trench-gated MOSFETs, to protect the corners of the trench against high electric fields that can generate hot carriers and damage the gate oxide layer; to minimize the threshold voltage necessary to turn the MOSFET on; and to maximize the resistance of the device to punchthrough breakdown across its channel region.

Figure 1:
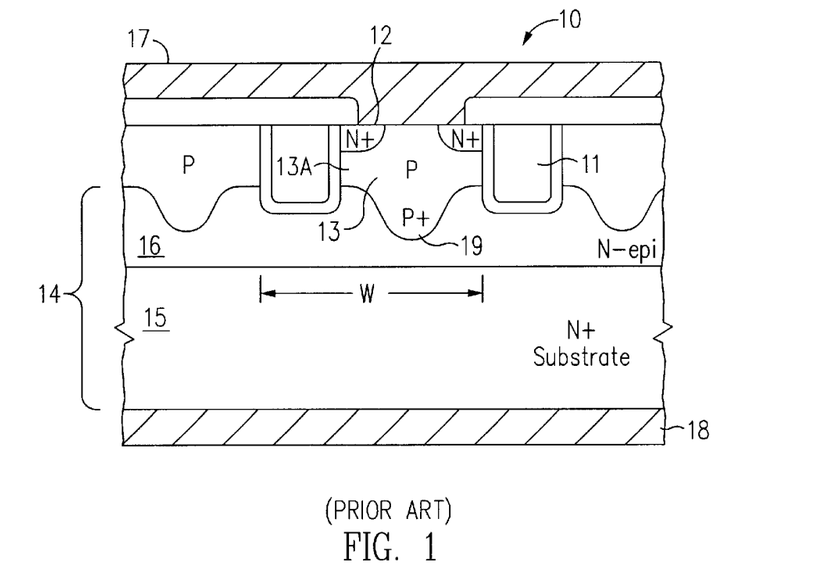
FIG. 1 shows a cross-sectional view of a trench-gated MOSFET in accordance with U.S. Pat. No. 5,072,266 to Bulucea et al.

U.S. Pat. No. 5,072,266 to Bulucea et al. teaches the formation of a deep body diffusion in the center of the MOSFET cell to protect the corners of the trench against high electric fields and hot carrier generation. An example of such a MOSFET is shown in FIG. 1, which shows a trench-gated MOSFET 10 including a gate 11, an N+ source region 12, a P-body 13, and a drain 14 which includes an N+ substrate 15 and an N-epitaxial layer 16. N+ source region is contacted by a metal layer 17 and drain 14 is contacted by a metal layer 18. In accordance with the teachings of the Bulucea et al. patent, a deep P+ diffusion 19 is formed in the center of the MOSFET cell. Deep P+ diffusion 19 is formed by implanting P-type dopant through the surface of the epitaxial layer 16 and heating the device to cause the dopant to diffuse downward to a level below the floor of the gate trench. The presence of the deep P+ diffusion causes the device to break down in the bulk silicon at the center of the MOSFET cell.

While the deep P+ diffusion does help to prevent hot carrier generation near the gate, it tends to limit the width W of the MOSFET cell and therefore the number of cells that can be formed within a given area of the chip This in turn limits the on-resistance of the device, because the total cell perimeter available to conduct current generally increases with the cell density. Conversely, if W is made too small, an excessive amount of P-type dopant gets into the channel region 13A during the diffusion process, and this increases the threshold voltage of the device.

Accordingly, there is a need for a power MOSFET which is not vulnerable to hot carrier injection and yet allows a greater packing density so as to reduce its on-resistance.

SUMMARY OF THE INVENTION

A power MOSFET in accordance with this invention includes a semiconductor substrate of a first conductivity type and an epitaxial layer formed on a surface of the substrate, the epitaxial layer including a portion in contact with the substrate. The doping concentration of the portion of the epitaxial layer is lighter than the doping concentration of the Substrate. A trench is formed at a surface of the epitaxial layer, the trench extending, into the epitaxial layer and having a plurality of section s which define a MOSFET cell. A gate is formed in the trench.

A source region of the first conductivity type is located adjacent a sidewall of the trench at a surface of the epitaxial layer in the MOSFET cell. A body of a second conductivity type adjoins the source region in the MOSFET cell, the body comprising a channel region adjacent the sidewall of the trench. A drain of the first conductivity type forms a first PN junction with the body, the body being located above the first PN junction, the drain being located below the first PN junction. The entire first PN junction is located at a level above a bottom of the trench, a portion of the first PN junction near the sidewall of the trench having a first breakdown voltage.

A heavily-doped region of the second conductivity type is formed within the body at a central region of the MOSFET cell, the dopant concentration of the heavily-doped region being greater than the doping concentration of the body, such that a diode comprising a portion of a second PN junction at the central region of the MOSFET has a second breakdown voltage, the second breakdown voltage being lower than the first breakdown voltage. As a result, avalanche breakdown takes place at the central region of the MOSFET cell rather than near the sidewall of the trench where hot carriers could cause damage to the gate oxide layer. The lower boundary of the heavily-doped region preferably extends to a level that is below the bottom junction of the body region but above the bottom of the trench.

Another aspect of the invention includes a method of fabricating a power MOSFET. The method comprises providing a semiconductor substrate of a first conductivity type; growing an epitaxial layer of the first conductivity on a surface of the substrate; forming a trench in the epitaxial layer, the trench defining a cell of the MOSFET; forming a first insulating layer on a surface of the trench; forming a gate in the trench, the gate being separated from the epitaxial layer by the insulating layer; implanting dopant of a second conductivity type into the epitaxial layer to form a body, a lower boundary of the body forming a first PN junction with a portion of the epitaxial layer of the first conductivity type; implanting dopant of the first conductivity type into the epitaxial layer to form a source region; depositing a second insulating layer over the epitaxial layer; forming an opening in the second insulating layer to expose at least a portion of the source region; implanting additional dopant of the second conductivity type into the epitaxial layer to form a heavily doped region, the heavily doped region being spaced apart from a wall of the trench and forming a second PN junction with the portion of the epitaxial layer of the first conductivity type; depositing a metal layer over the second insulating layer such that the metal layer contacts the portion of the source region; and limiting the thermal energy to which the power MOSFET is exposed following the implantation of the body such that the body does not diffuse substantially. As a result, the body remains quite compact and a high cell packing density can be obtained.

In one embodiment, the thermal budget following the formation of the first insulating layer through the deposition of the metal layer is less than or equal to the equivalent of 950° C. for 60 minutes. In another embodiment, the thermal budget following the formation of the first insulating layer through the deposition of the metal layer is less than or equal to the equivalent of 900° C. for 50 minutes.

DESCRIPTION OF THE INVENTION

Figure 2A:
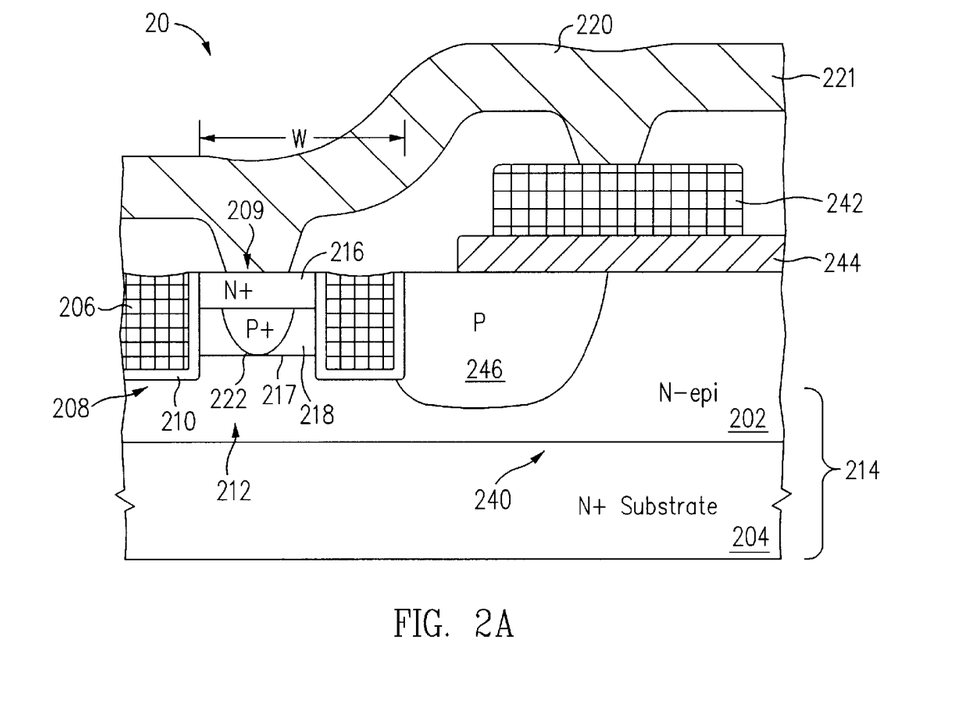
FIG. 2A shows a cross-sectional view of a trench-gated MOSFET in accordance with this invention, including a heavily doped region at the center of the MOSFET cell.

A cross-sectional view of a trench-gated power MOSFET in accordance with this invention is shown in FIG. 2A. MOSFET 20 is formed in an N-type epitaxial ("epi") layer 202, which is grown on an N+ substrate 204. A polysilicon gate 206 is located in a trench 208 and is isolated from the N-epi layer 202 by a gate oxide layer 210. A single MOSFET cell 212 is located between opposing segments of gate 206, it being understood that a typical power MOSFET would include a large number of MOSFET cells arrayed in a lattice-like arrangement. The individual cells could be closed geometric figures such as squares or hexagons or could be longitudinal stripes. The sections of the trench 208 define a mesa 209 which is typically from 1 µm to 4 µm wide. French 208 is typically from 0.7 µm to 1.6 µm deep.

The N-epi layer 202 and N+ substrate 204 together form a drain region 214 of MOSFET 20, which is contacted by a metal layer (not shown) on the bottom of the N+ substrate 204. MOSFET cell 212 includes an N+ source region 216 and a P-body 218. N+ source region 216 is contacted by a metal layer 220 through openings in a borophosphosilicate glass (BPSG) layer 221. P-body 218 is contacted in a region outside the plane of the drawing. N+ source region 216 and P-body 218 are normally shorted together to prevent the parasitic bipolar transistor represented by drain region 214, P-body 218 and N+ source region 216 from becoming active.

Also shown in FIG. 2A is a termination region 240, which includes a polysilicon field plate 242 formed over an oxide layer 244. Termination region 240 also includes a P-region 246. As shown, field plate 242 is contacted by metal layer 220 through an opening in BPSG layer 221.

In accordance with this invention, P-body 218 includes a relatively heavily doped P+ region 222. In the embodiments shown in FIGS. 2A and 2B, P+ region 222 extends all the way to meet a substantially planar horizontal PN junction 217 between P-body 218 and N-epi layer 202. In other embodiments, P+ region 292 extends downward to a level below PN junction 217 (as shown in FIG. 2C), but in most embodiments P+ region 218 does not extend to a level below the bottom of the trench 208. In some embodiments, as shown in FIG. 2D, the lower extremity of P+ region may be at a level above PN junction. In all embodiments, P+ region 222 is doped to a level such that a diode is formed in the center of MOSFET cell 212, the anode of the diode being represented by P+ region 222 and the cathode of the diode being represented by the N-epi layer 202. The central diode in MOSFET cell 212 has a breakdown voltage which is lower that the breakdown voltage of the PN junction 217 nearer the walls of the trench 208. Thus avalanche breakdown occurs in MOSFET 20 at the center of MOSFET cell 212, at a location where damage to the gate oxide layer 210 is avoided. At the same time, there is no deep diffusion in MOSFET cell 212 which limits the width W of MOSFET cell 212

Figure 2B:
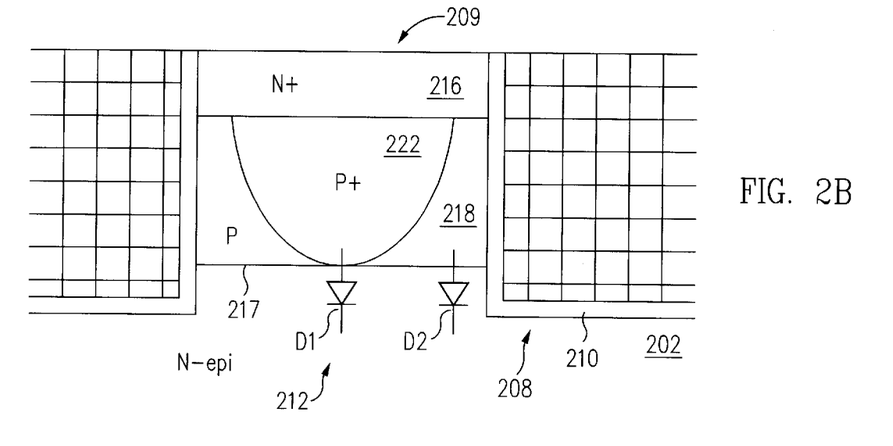
FIG. 2B shows a detailed view of the body region of the MOSFET shown in FIG. 2A wherein the deepest portion of the P+ region coincides with the body-drain junction.
Figure 2C:
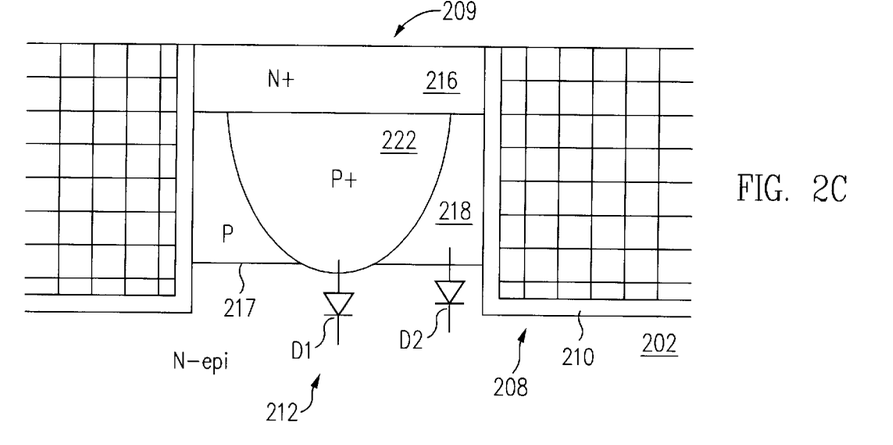
FIG. 2C shows a detailed view of the body region of a MOSFET according to the invention wherein the deepest portion of the P+ region is located below the body-drain junction.
Figure 2D:
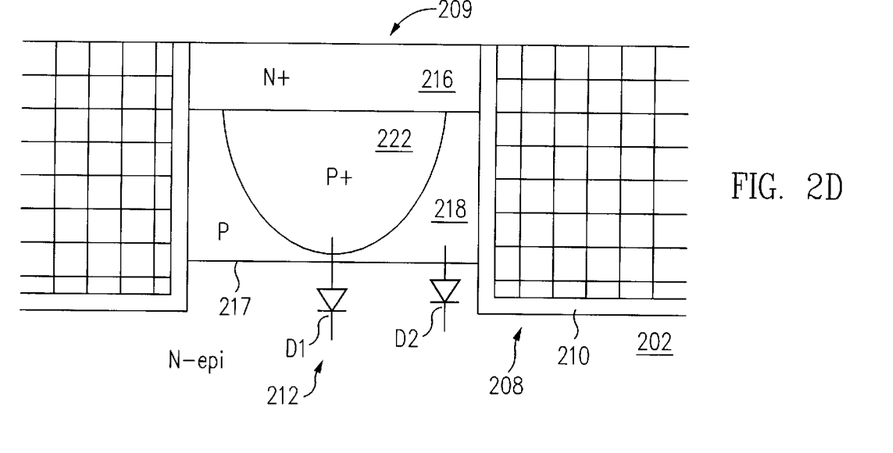
FIG. 2D shows a detailed view of the body region of a MOSFET according to the invention wherein the deepest portion of the P+ region is located above the body-drain junction.

Body region 218 is shown in detail in FIG. 2B. Because of the concentration of dopant in P+ region 222, the breakdown voltage of diode D1 at the center of MOSFET cell 212 is lower than the breakdown voltage of diode D2 near the wall of trench 208. Thus diode D1 breaks down before diode D2 and prevents the generation of hot carriers near trench 208 and gate oxide layer 210.

FIGS. 3A–3G illustrate the steps of a process for forming MOSFET 20.

Figure 3A:
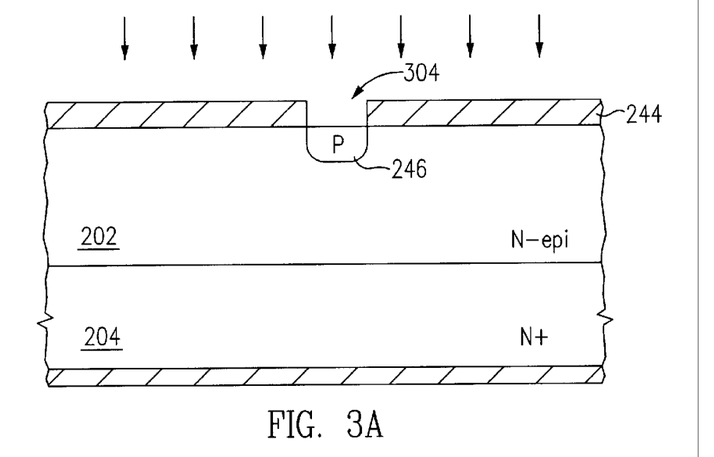
FIGS. 3A–3G illustrate the steps of a process that can be used to fabricate a MOSFET in accordance with this invention.

The process begins with the formation of N-epi layer 202 on a surface of N+ substrate 204, as shown in FIG. 3A. This step is performed by a known process of epitaxial growth. N-epi layer 202 may be, for example 4 µm thick and may be doped with N-type impurity to a concentration of $3.5 \times 10^{16}$ cm$^{-3}$ in the case of a 30V device.

Oxide layer 244 is grown on the top surface of N-epi layer 202 and, by a known photolithographic process employing a first mask, a hole 304 is formed in oxide layer 244. A P-type impurity such as boron is implanted into N-epi layer 202 through hole 304 to form P region 246. This implant may be carried out, for example, at a dose of $1 \times 10^{14}$ cm$^{-2}$ and an energy of 60 keV.

Figure 3B:
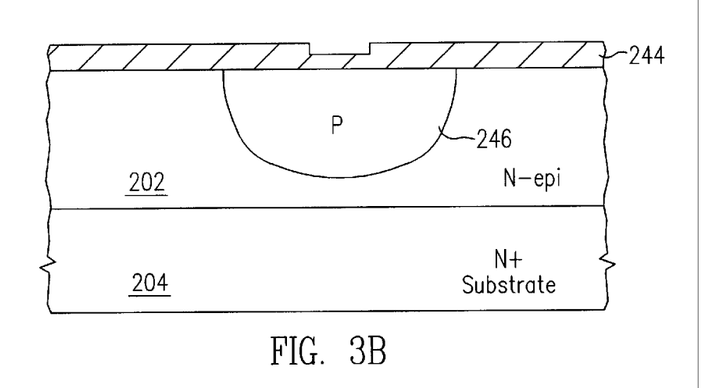

P region 246 then driven-in at, for example, a temperature of 950° C. for 180 minutes in a wet atmosphere. P region 246 diffuses both laterally and vertically as shown in FIG. 3B.

Figure 3C:
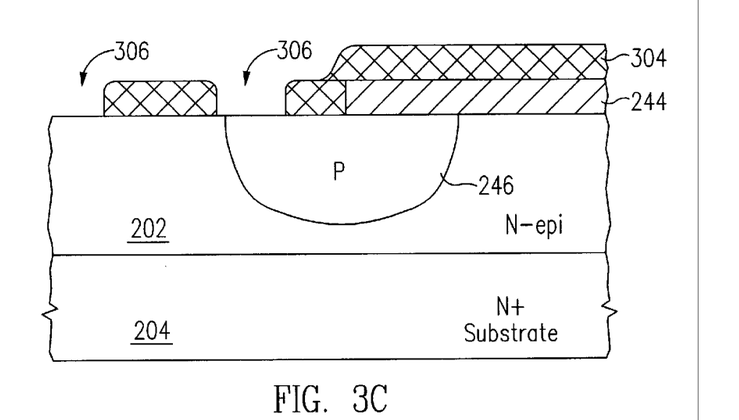

A second photolithographic mask (not shown) is then formed, exposing what is to be the active area of the device, and oxide layer 244 is etched as shown in FIG. 3C. A third, trench mask 304 is then formed, with gaps 306 where the trench 208 is to be located, also as shown in FIG. 3C.

Figure 3D:
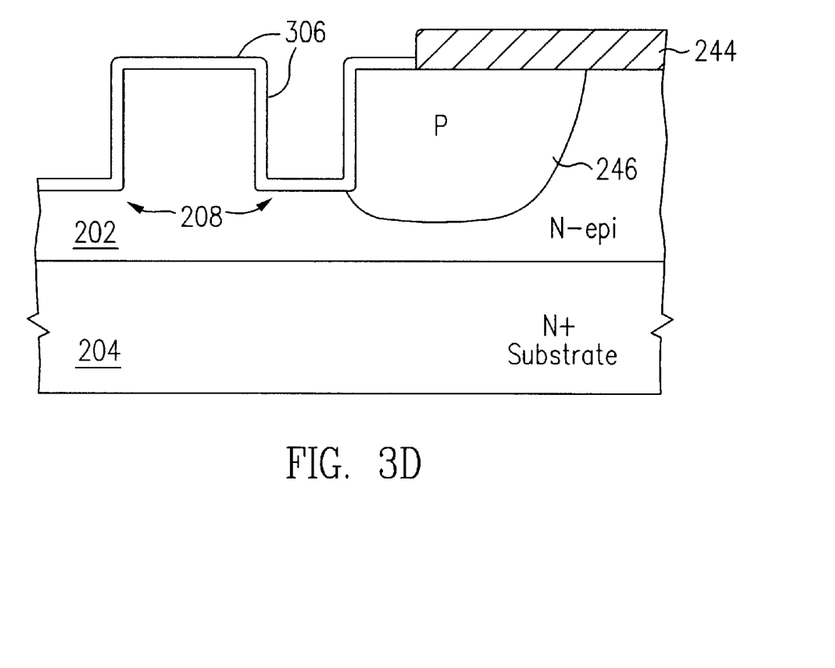

The trench 208 is etched in N-epi layer 202 through mask 304, using a reactive ion etch (RIE) process. Trench 208 can be 0.8 µm wide and 0.9 µm deep, for example. A sacrificial oxide layer (not shown) can be grown on the exposed surfaces of N-epi layer 202 to repair the damage caused by the RIE etch. The sacrificial oxide layer is removed, and gate oxide layer 306 is grown to a thickness of, for example, 600 Angstroms on the exposed surfaces of N-epi layer 202, including in particular the sidewalls and floor of trench 208, as shown in FIG. 3D.

Figure 3E:
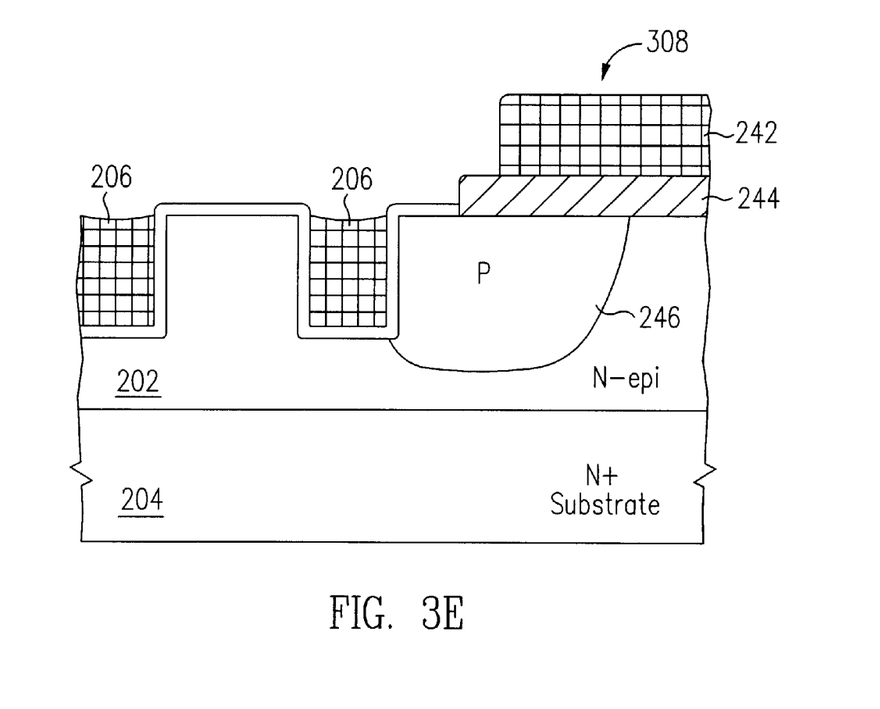

A polysilicon layer 308, which can be 1 µm thick, is deposited over the top surface of the structure, and a fourth mask (not shown) is formed on the surface of polysilicon layer 308. Polysilicon layer 308 is then etched, leaving gate 206 and field plate 242, as shown in FIG. 3E. The top surface of gate 206 is roughly coplanar with the top surface of N-epi layer 202.

Figure 3F:
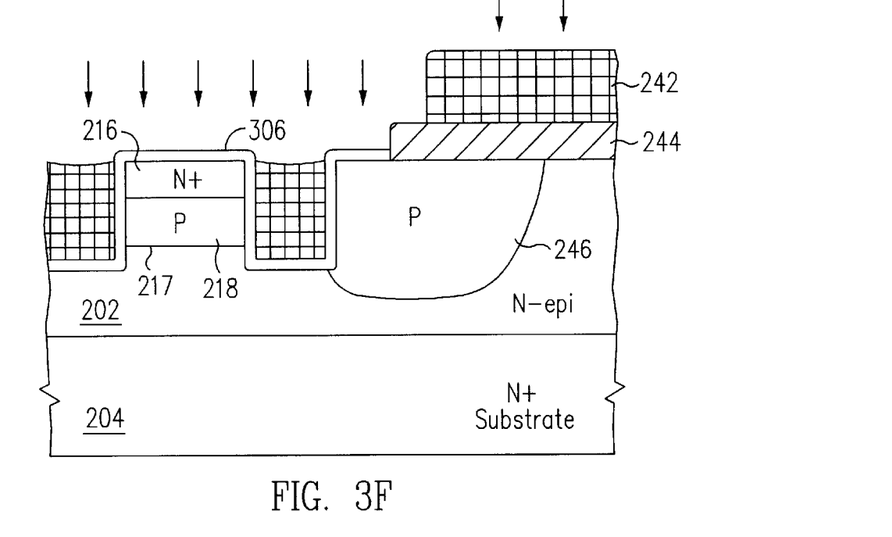
Figure 3G:
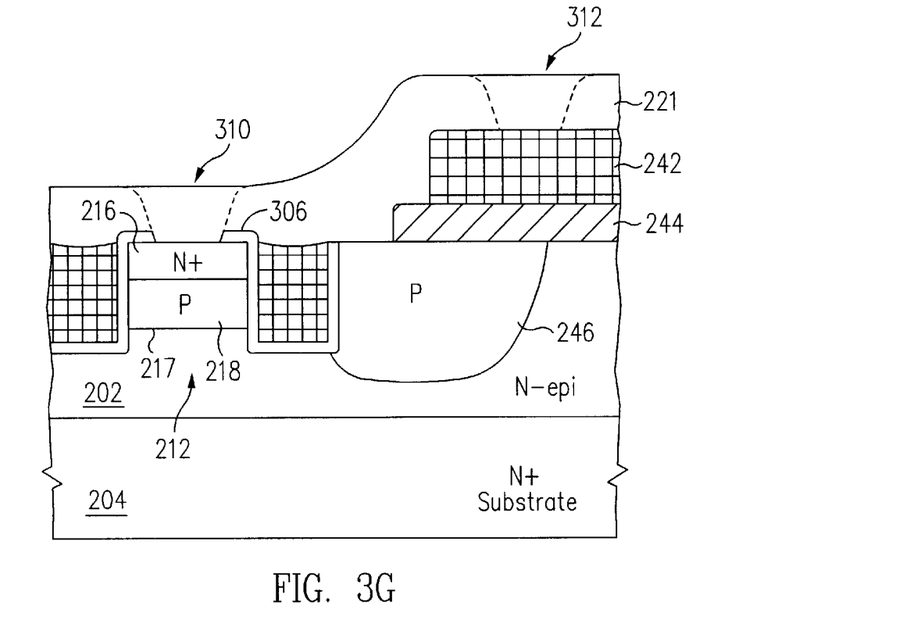

As shown in FIG. 3F, P-body 218 is formed by implanting P-type impurity, for example boron, into N-epi layer 202. This is preferably accomplished using two implant steps: for example, the first at a dose of $6 \times 10^{12}$ cm$^{-2}$ and an energy of 80 keV, and the second at a dose of $6 \times 10^{12}$ cm$^{-2}$ and an energy of 150 keV. As shown in FIG. 3F, because the implantation goes into the entire region between the portions of trench 208, a PN junction 217 between P-body 218 and N-epi layer is substantially horizontal and planar.

Next a fifth photolithographic mask (not shown) is formed, blocking the areas where the P-body is to be contacted in the third dimension with respect to the plane of FIGS. 3A–3G. An N-type dopant such as arsenic is implanted, for example at a dose of $8 \times 10^{15}$ cm$^{-2}$ and an energy of 80 keV, to form N+ source region 216. The fifth photolithographic mask is then removed.

BPSG layer 221 is then deposited and allowed to flow at, for example, 875° C. for 25 minutes. A sixth, contact mask (not shown) is formed on BPSG layer 221 with holes where contact will be made to N+ source region 216, field plate 242, and P-body 218. BPSG layer 221 and gate oxide layer 306 are etched through the holes in the sixth mask, forming, an opening 310 to N+ source region, an opening 312 to field plate 242, and an opening (not shown) to P-body 218. Openings 310 and 312 are shown in dashed lines in FIG. 3G.

A P-type impurity such as boron is then implanted through these openings to form P+ region 222. This can be done in a two-stage process, the first stage being, performed at a dose of $1 \times 10^{15}$ cm$^{-2}$ and an energy of 60 keV and the second stage being performed at a dose of $1 \times 10^{15}$ cm$^{-2}$ and an energy of 120 keV. Alternatively, the first stage can be performed at a dose of $2 \times 10^{15}$ cm$^{-2}$ and an energy of 60 keV and the second stage can be performed at a dose of $3 \times 10^{14}$ cm$^{-2}$ and an energy of 120 keV, or the boron can be implanted in a one-stage process at a dose of $2 \times 10^{15}$ cm$^{-2}$ and an energy of 100 keV. Because BPSG layer 221 overlaps the edges of N+ source region 216 near the sidewalls of trench 208, the P-type impurity is confined to a central region of the MOSFET cell 212. The energy of the implant can be adjusted to insure that the deepest portion of P+ region 222, coincides with the planar PN junction 217 between P-body region 218 and N-epi layer 202 (as shown in FIGS. 2A and 2B), is located below the PN junction 217 (as shown in FIG. 2C), or is located above the PN junction (as shown in FIG. 2D).

Next, BPSG layer 221 is reflowed at, for example, 900° C. for 30 minutes and metal layer 220, typically aluminum, is deposited to a thickness of, for example, 2.8 μm. A seventh, metal mask is formed over the surface of metal layer 220, and metal layer 220 is etched in a conventional manner to form a source-body bus.

The result of the process is MOSFET 20 shown in FIGS. 2A–2D.

It is important that, following the implantation of P-body 218, the "thermal budget" of the process be limited such that P-body 218 does not diffuse appreciably but instead remains localized in the "mesa" between the sections of trench 208. After the implantation of P-body 218, the junction of P-body 218 and N-epi layer 202 should not move more than about 0.3 μm, and preferably not more than about 0.1 μm. For example, the total "thermal budget" to which the structure is exposed following the implantation of P-body 218 should be limited to an amount that is less than or equal to the equivalent of 1050° C. for 30 minutes and preferably less than 950° C. for 60 minutes. Alternatively, the structure could be given a rapid thermal anneal (RTA) at about 1100° C. for about 120 seconds. This thermal budget includes the heating required to flow and reflow BPSG layer 221, as described above.

Figure 4A:
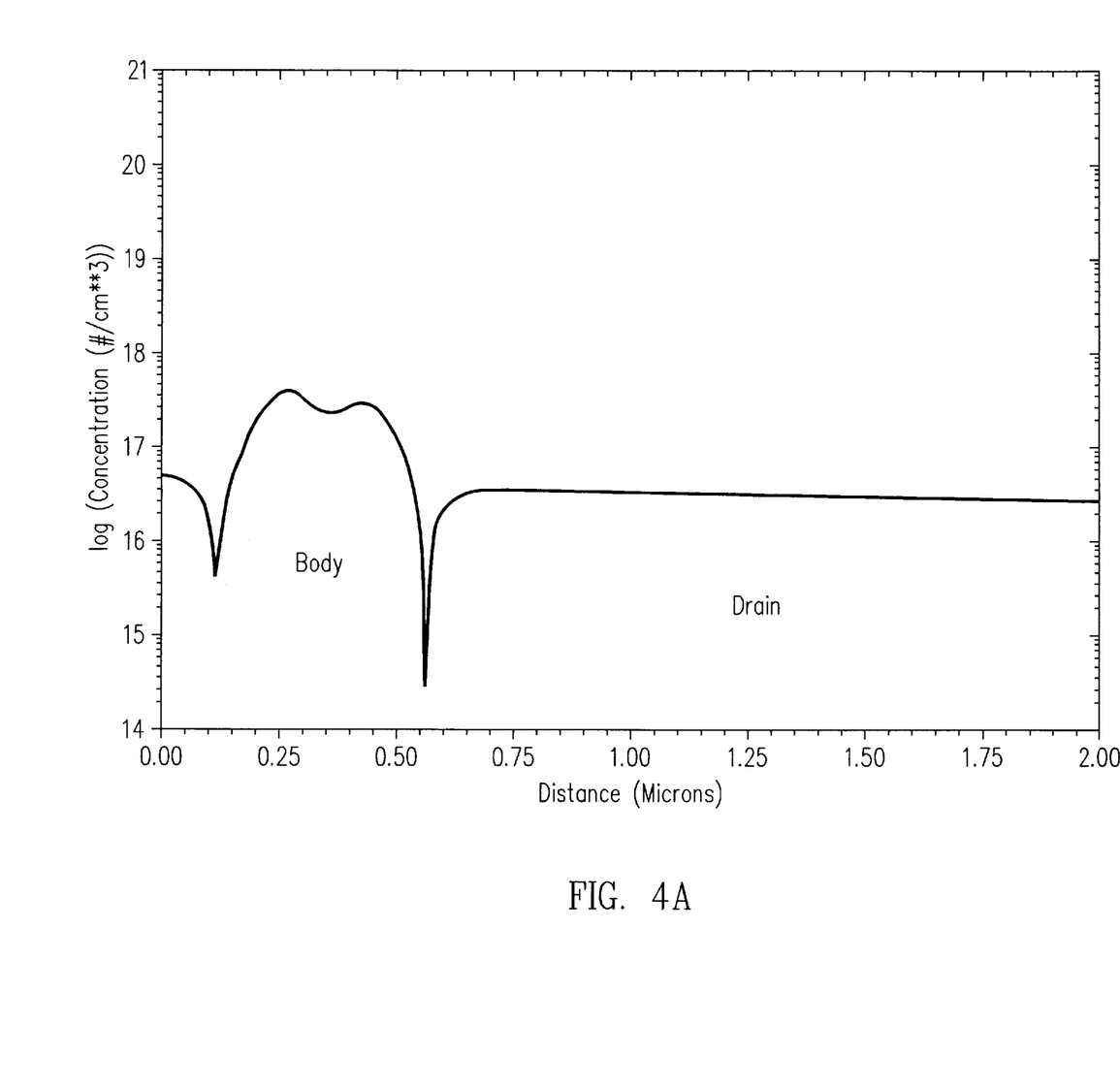
FIGS. 4A and 4B are graphs showing the doping profile in a vertical cross-section through the mesa of a MOSFET fabricated in accordance with this invention.
Figure 4B:
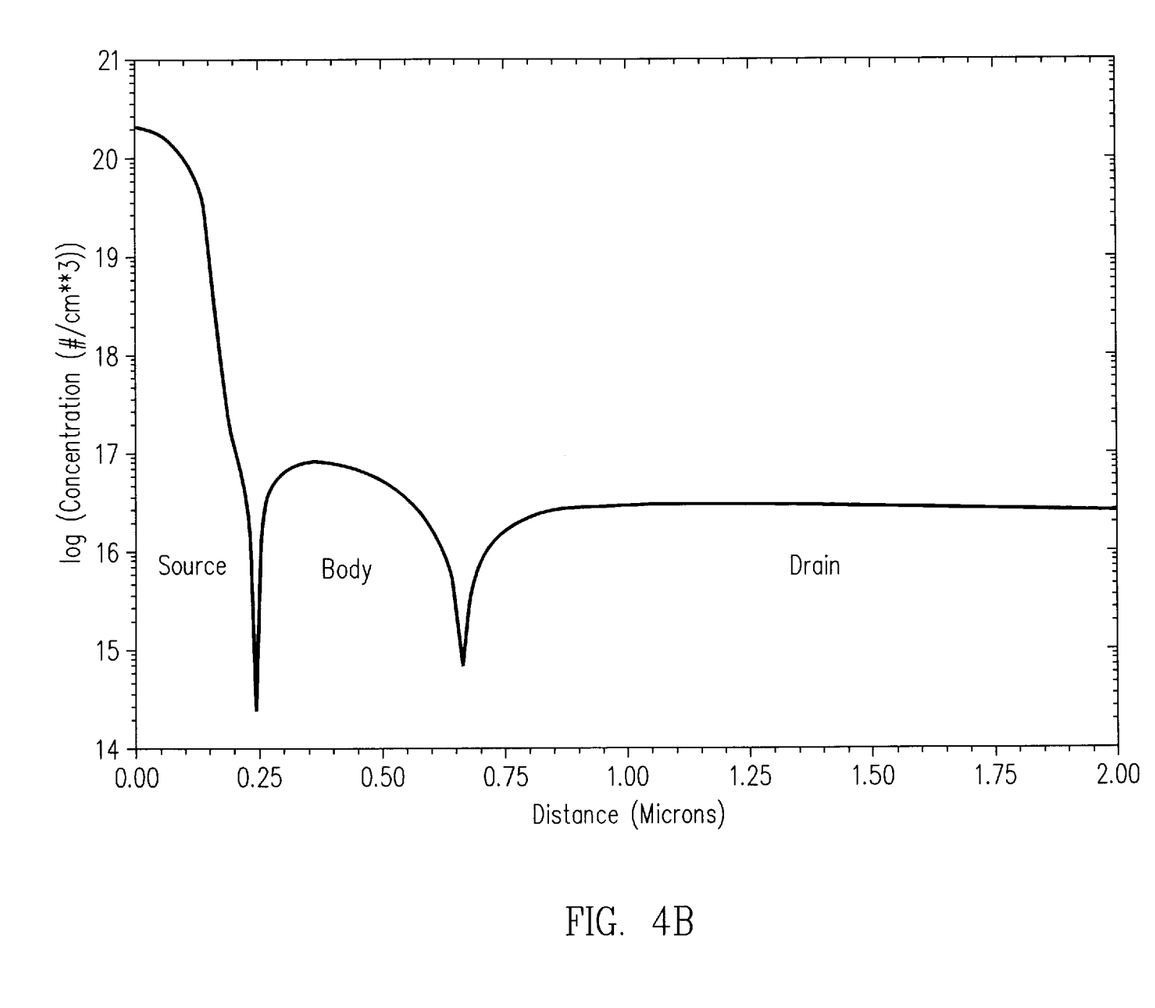
Figure 4C:
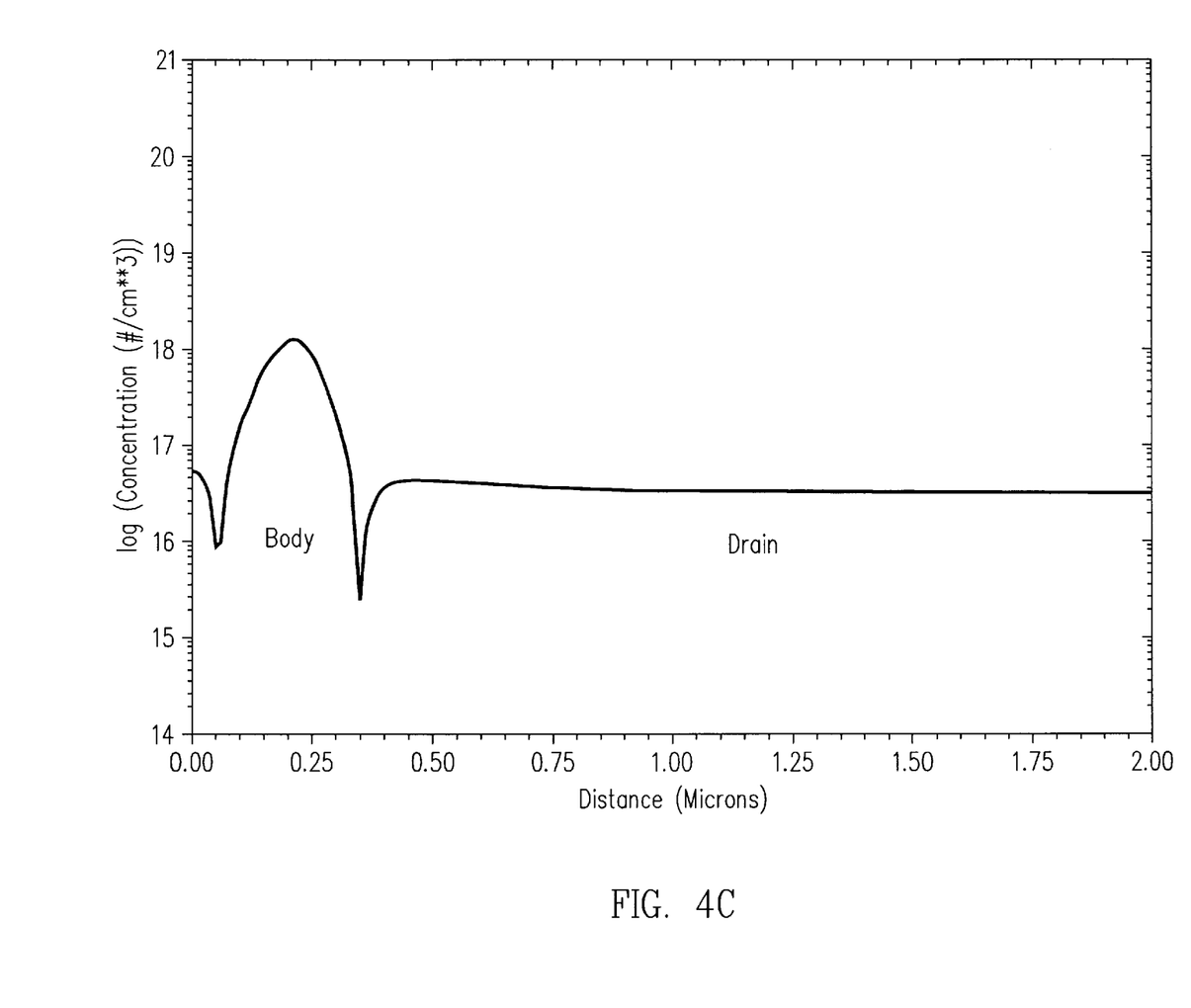
FIGS. 4C and 4D are graphs showing the doping profile in a vertical cross-section through the mesa of a MOSFET fabricated by a conventional process.
Figure 4D:
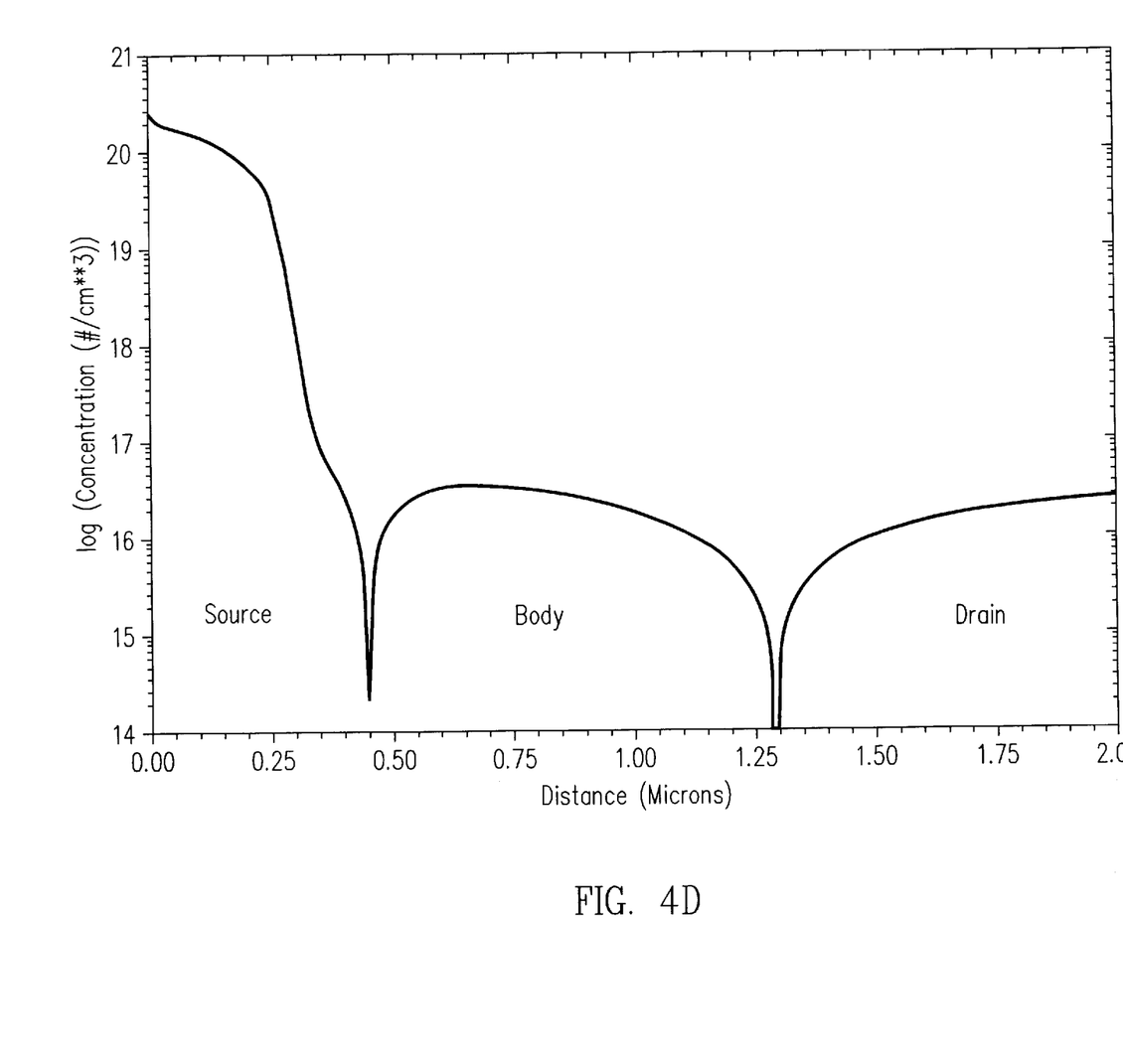

FIGS. 4A and 4B show dopant profiles taken at a vertical cross-section of the mesa in a device fabricated in accordance with this invention. FIG. 4A shows the dopant profile immediately following the implantation of the P-body. FIG. 4B shows the dopant profile after the source has been implanted and both implanted dopants have been made electrically active during the BPSG flow and reflow anneals. Note the twin peaks in FIG. 4A from the two-stage implant. As indicated by a comparison of FIGS. 4A and 4B the junction between the P-body and the N-type drain moved from a level about 0.55 μm below the top surface of the mesa to a level about 0.65 μm below the surface of the mesa, i.e., about 0.1 μm. The peak doping concentration in the P-body was about $1 \times 10^{17}$ cm$^{-3}$. By comparison, FIGS. 4C and 4D show the dopant profiles in a conventional MOSFET after implantation of the P-body and in the finished device, respectively. Owing to the conventional diffusion of the body, the body-drain junction moved almost 1.0 μm deeper into the mesa, and the peak dopant concentration in the body was about $5 \times 10^{16}$ cm$^{-3}$.

The process described above is suitable for fabricating a 30V MOSFET. MOSFETs with different voltage ratings can be fabricated by varying the parameters of the process, in particular the thickness of N-epi layer 202 and gate oxide layer 210 and the doping concentration of P-body 218. Table 1 gives typical process parameters for 20V, 30V and 60V devices, including the gate oxide thickness $T_{ox}$, the N-epi thickness $T_{epi}$, the N-epi doping concentration $N_{epi}$, and the implant dose and energy required to create the P-body and avoid punchthrough breakdown. In each case the P-body is doped in a two-stage process to implant enough charge into the P-body region. The implant doses ($D_1, D_2$) and energies ($E_1, E_2$) for both of the stages is given.

TABLE 1

| Rating | $T_{ox}$ | $T_{epi}$ | $N_{epi}$ (cm$^{-3}$) | Dose$_1$ (cm$^{-2}$) | $E_1$ (keV) | Dose$_2$ (cm$^{-2}$) | $E_2$ (keV) |
|---|---|---|---|---|---|---|---|
| 20 V | 500 A | 3.5 μm | 8E16 | 1E13 | 80 | 1E13 | 150 |
| 30 V | 600 A | 4 μm | 3.5E16 | 6E12 | 80 | 6E12 | 150 |
| 60 V | 700 A | 5.5 μm | 9E15 | 4E12 | 80 | 4E12 | 150 |

As noted above, a diode is formed at the center of the MOSFET cell. Dopant is implanted into the body to ensure that the central diode (D1) has an avalanche breakdown voltage lower than the avalanche breakdown voltage of the body-drain junction near the sidewall of the trench. In the example described above, the source contact opening in the BPSG layer is used for implanting the dopant but this need not be the case. Other masks or layers may be used to localize the dopant in the central area of the MOSFET cell.

The breakdown voltage of diode D1 is a function of the doping concentration and gradient of P+ region 222 at its junction with N-epi layer 202 at the center of MOSFET cell 212. Similarly, the breakdown voltage of diode D2 is a function of the doping concentration and gradient of the P-body 218 at its junction with N-epi layer 202 near gate trench 208 and includes the effects of the trench corners. These relationships are well known and are available from many sources, such as Sze, *Physics of semiconductor Devices*, 2nd Ed., Wiley Interscience (1981), p. 101 (FIG. 26), which is incorporated herein by reference. The depth of the trench 208 should not exceed by too much the depth of the P-body junction. In a preferred embodiment, the trench 208 is deeper than the P-body 218 by about 0.3 μm.

The embodiment described above is illustrative only and not limiting. Many other embodiments in accordance with this invention will be apparent to those skilled in the art from the description above.

We claim:

1. A power MOSFET comprising:

a semiconductor substrate of a first conductivity type;

an epitaxial layer formed on a surface of the substrate, the epitaxial layer including a portion in contact with the substrate and being doped to a first conductivity to a concentration lighter than a doping concentration of the substrate;

a trench formed at a surface of the epitaxial layer, the trench extending into the epitaxial layer, the trench having a plurality of sections which define a MOSFET cell;

a gate formed in the trench;

a source region of the first conductivity type located adjacent a sidewall of the trench at a surface of the epitaxial layer in the MOSFET cell;

a body of a second conductivity type located in the epitaxial layer, the body adjoining the source region in the MOSFET cell and comprising a channel region adjacent the sidewall of the trench;

a drain of the first conductivity type comprising the substrate and the portion of the epitaxial layer, the drain forming a PN junction with the body, the body being located above the PN junction, the drain being located below the PN junction, the entire PN junction being located at a level above a bottom of the trench, a first portion of the PN junction near the sidewall of the trench having a first breakdown voltage; and a heavily-doped region of the second conductivity type within the body at a central region of the MOSFET cell, the dopant concentration of the heavily-doped region being greater than a doping concentration of a remaining portion of the body, such that a diode comprising a second portion of the PN junction at the central region of the MOSFET has a second breakdown voltage, the second breakdown voltage being lower than the first breakdown voltage.

2. The power MOSFET of claim 1 wherein the PN junction is substantially planar.

3. The power MOSFET of claim 2 wherein a deepest point of the heavily-doped region is coincident with a plane defined by the PN junction.

4. The power MOSFET of claim 2 wherein a deepest point of the heavily-doped region is located below a plane defined by the PN junction but above the level of the bottom of the trench.

5. The power MOSFET of claim 2 wherein a deepest point of the heavily-doped region is located above a plane defined by the PN junction.

6. The power MOSFET of claim 1 further comprising a metal layer in contact with the source region.

7. The power MOSFET of claim 6 further comprising a termination region and a field plate located in the termination region, the metal layer being in contact with the field plate.

8. The power MOSFET of claim 7 wherein the metal layer is in contact with the body.

9. The power MOSFET of claim 7 wherein the termination region further comprises a diffusion of the second conductivity type.

* * * * *